United States Patent
Choi et al.

(10) Patent No.: US 7,532,538 B2
(45) Date of Patent: May 12, 2009

(54) TRI-STATE OUTPUT DRIVER ARRANGING METHOD AND MEMORY DEVICE USING THE SAME

(75) Inventors: Seouk-Kyu Choi, Gyeonggi-do (KR); Woo-Pyo Jeong, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 11/567,664

(22) Filed: Dec. 6, 2006

(65) Prior Publication Data
US 2007/0165475 A1 Jul. 19, 2007

(30) Foreign Application Priority Data
Jan. 13, 2006 (KR) .................... 10-2006-0003961

(51) Int. Cl.
*G11C 8/00* (2006.01)
(52) U.S. Cl. .............. 365/230.06; 365/233.13; 365/189.03; 365/189.15; 365/189.18; 365/189.05
(58) Field of Classification Search ............ 365/233.13, 365/230.06, 189.03, 189.15, 189.18, 189.05
See application file for complete search history.

(56) References Cited

U.S. PATENT DOCUMENTS

| | | | |
|---|---|---|---|
| 5,841,702 A * | 11/1998 | Kim ................. | 365/189.05 |
| 5,966,338 A | 10/1999 | Liu et al. | |
| 5,966,339 A | 10/1999 | Hsu et al. | |
| 6,788,112 B1 | 9/2004 | Chan et al. | |
| 2004/0057322 A1* | 3/2004 | Kim et al. .............. | 365/230.06 |
| 2004/0153603 A1* | 8/2004 | Janzen ..................... | 711/106 |

FOREIGN PATENT DOCUMENTS

| | | |
|---|---|---|
| JP | 2001-319476 | 11/2001 |
| KR | 1997-009981 | 3/1997 |

OTHER PUBLICATIONS

English language abstract of Korean Publication No. 1997-009981 (for 1998-074245).
English language abstract of Japanese Publication No. 2001-319476.

\* cited by examiner

*Primary Examiner*—Hoai V Ho
*Assistant Examiner*—Fernando N Hidalgo
(74) *Attorney, Agent, or Firm*—Marger Johnson & McCollom, P.C.

(57) ABSTRACT

A memory device includes a first sensing amplifier to amplify data received from the memory array, a first driver to generate a first tri-state signal responsive to the amplified data from an first sense amplifier and to provide the first tri-state signal to a data bus line, a second sensing amplifier to amplify data received from the memory array, and a second driver to generate a second tri-state signal responsive to the amplified data from an second sense amplifier and to provide the second tri-state signal to the data bus line, where the first sensing amplifier and the first driver are located in different regions of the device, and the second sensing amplifier and the second driver are located in a common region of the device.

12 Claims, 3 Drawing Sheets

TRI-STATE OUTPUT DRIVER ARRANGING METHOD AND MEMORY DEVICE USING THE SAME

RELATED PATENT APPLICATIONS

This application claims the priority of Korean Patent Application No. 10-2006-0003961, filed on Jan. 13, 2006, which is incorporated by reference.

BACKGROUND OF THE INVENTION

1. Field of the Invention

The present invention relates to a memory device, and more particularly, to a tri-state output driver configuration.

2. Description of the Related Art

As demand increases for high-speed systems, many of these systems attempt to increase the operating speeds of their memory devices. To increase the operating speed, a semiconductor memory device can minimize a data signal transmission delay in a data path. An example of a data path structure of a semiconductor memory device is disclosed in U.S. Pat. No. 5,966,338.

FIG. 1 is a circuit diagram of a semiconductor memory device that uses a conventional tri-state output driver configuration. Referring to FIG. 1, the semiconductor memory device includes first and second input/output (I/O) line sensing amplifying circuits 11 and 13. The first and second I/O line sensing amplifying circuits 11 and 13 are connected to a data bus line DB, and first and second I/O lines IO1 and IO2, respectively. The first and second I/O lines IO1 and IO2 are connected to a memory cell array (not shown).

When the semiconductor memory device is a double data rate (DDR) synchronous DRAM having an X32 bit organization, there are 32 even-numbered I/O line sensing amplifying circuits and 32 odd-numbered I/O line sensing amplifying circuits are connected to the data bus line DB. For convenience of explanation, FIG. 1 illustrates two I/O line sensing amplifying circuits 11 and 13, the first I/O line sensing amplifying circuit 11 is an even-numbered I/O line sensing amplifying circuit, and the second I/O line sensing amplifying circuit 13 is an odd-numbered I/O line sensing amplifying circuit.

The first I/O line sensing amplifying circuit 11 includes a sensing amplifier 11A that receives and amplifies data received via the first I/O line IO1, and a driver 11B that outputs a tri-state output via the data bus line DB in response to a signal received from the sensing amplifier 11A. The second I/O line sensing amplifying circuit 13 includes a sensing amplifier 13A that receives and amplifies data received via the second I/O line IO2, and a driver 13B that outputs a tri-state output via the data bus line DB in response to a signal received from the sensing amplifier 13A. A signal transmitted via the data bus line DB is output via a multiplexer 15.

The sensing amplifier 11A and the driver 11B of the first I/O line sensing amplifying circuit 11 are arranged together in the same region, and the sensing amplifier 13A and the driver 13B of the second I/O line sensing amplifying circuit 13 are arranged together in a different region. The conventional tri-state output driver configuration described above requires a large data bus line DB, which increases the load on the data bus line DB. The large data bus line DB has a large delay in data transmission that slows the operating speed of the semiconductor memory device.

SUMMARY OF THE INVENTION

Embodiments of the present invention provide a tri-state output driver arranging method and a memory device using the same. A memory device includes a first sensing amplifier to amplify data received from the memory array, a first driver to generate a first tri-state signal responsive to the amplified data from an first sense amplifier and to provide the first tri-state signal to a data bus line, a second sensing amplifier to amplify data received from the memory array, and a second driver to generate a second tri-state signal responsive to the amplified data from an second sense amplifier and to provide the second tri-state signal to the data bus line, where the first sensing amplifier and the first driver are located in different regions of the device, and the second sensing amplifier and the second driver are located in a common region of the device.

BRIEF DESCRIPTION OF THE DRAWINGS

The above and other aspects and advantages of the present invention will become more apparent in the detailed description of embodiments with reference to the attached drawings.

DETAILED DESCRIPTION OF THE INVENTION

Figure 1:
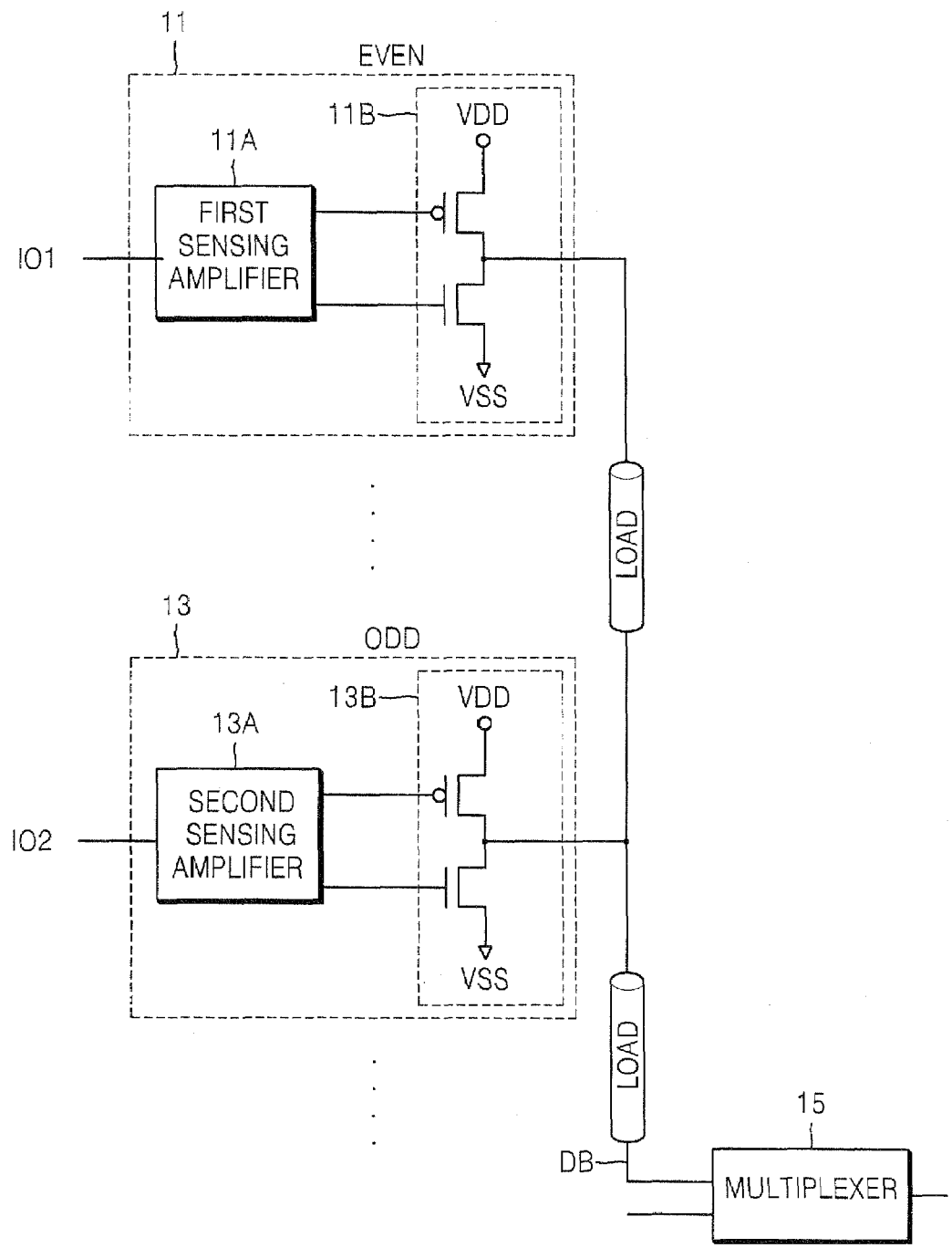
FIG. 1 is a circuit diagram of a semiconductor memory device that uses a conventional tri-state output driver configuration including input/output (I/O) line sensing amplifying circuits.
Figure 2:
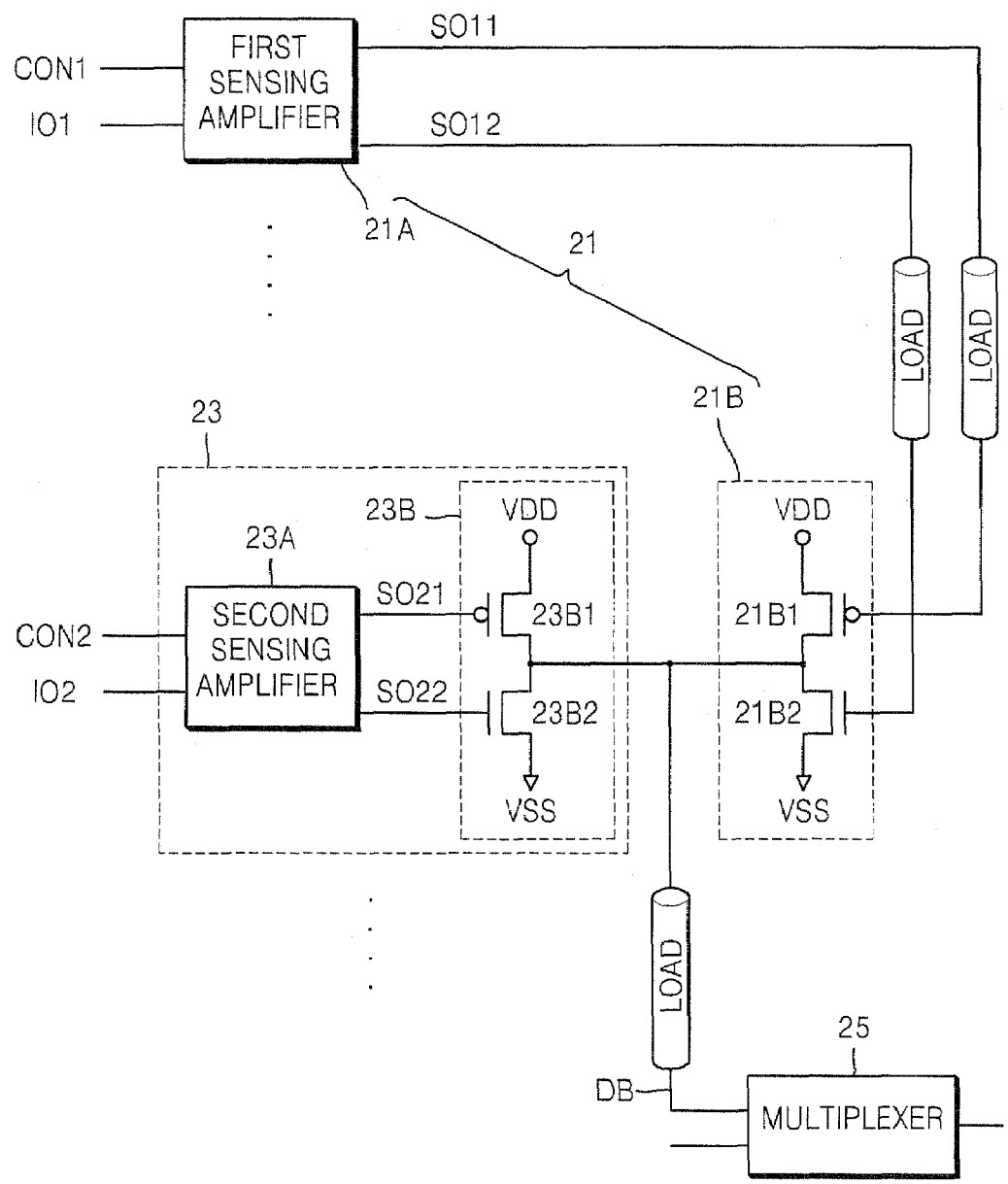
FIG. 2 is a circuit diagram of a memory device that uses a tri-state output driver configuration according to embodiments of the present invention.

FIG. 2 is a circuit diagram of a memory device that uses a tri-state output driver configuration according to embodiments of the present invention. Referring to FIG. 2, a plurality of first and second input/output (I/O) line sensing amplifying circuits 21 and 23 are connected to a data bus line DB, and first and second I/O lines IO1 and IO2, respectively. The first and second I/O lines IO1 and IO2 may be connected to a memory cell array (not shown).

When the memory device is a double data rate (DDR) synchronous DRAM (SDRAM) having an X32 bit organization, 32 even-numbered I/O line sensing amplifying circuits and 32 odd-numbered I/O line sensing amplifying circuits are connected to a data bus line DB. FIG. 2 illustrates two I/O line sensing amplifying circuits 21 and 23, where the first I/O line sensing amplifying circuit 21 may be an even-numbered I/O line sensing amplifying circuit and the second I/O line sensing amplifying circuit 23 may be an odd-numbered I/O line sensing amplifying circuit.

Each of the first and second I/O line sensing amplifying circuits 21 and 23 includes a sensing amplifier and a driver. The first I/O line sensing amplifying circuit 21 includes a first sensing amplifier 21A to amplify data received from the first I/O line IO1. The first sensing amplifier 21A sends the amplified data or signals SO11 and SO12 to a first driver 21B, which generates and provides a tri-state output to the data bus line DB in response to signals SO11 and SO12 received from the first sensing amplifier 21A.

The second I/O line sensing amplifying circuit 23 includes a second sensing amplifier 23A to amplify data received from the second I/O line IO2. The second sensing amplifier 23A sends the amplified data or signals SO21 and SO22 to a second driver 23B, which generates and provides a tri-state output to the data bus line DB in response to signals SO21 and SO22 received from the second sensing amplifier 23A. The tri-state output from the first and second I/O line sensing amplifying circuits 21 and 23 is transmitted over the data bus line DB to a multiplexer 25.

The second sensing amplifier 23A and the second driver 23B of the second I/O line sensing amplifying circuit 23 are arranged or configured in a common region of the memory device, while the first sensing amplifier 21A and the first driver 21B of the first I/O line sensing amplifying circuit 21 are arranged or configured in separate regions. The first driver 21B of the first I/O line sensing amplifying circuit 21 is arranged such that a load associated with the tri-state output from the first driver 21B is substantially the same as a load associated with the tri-state output from the second driver 23B of the second I/O line sensing amplifying circuit 23. In some embodiments, the first and second drivers 21B and 23B provide tri-state outputs at a substantially common location on the data bus line DB.

The configuration of the first and second drivers 21B and 23B in the memory device allows for a reduction in length of the data bus line DB, thereby decreasing the load on the data bus line DB and the data transmission delay. This reduction in delay and load may improve the operating speed of the memory device.

The first driver 21B includes a PMOS drive transistor 21B1 and an NMOS drive transistor 21B2 to output a tri-state output (a logic-high output, a logic-low output, or a float output) to the data bus line DB according to the logic levels of the control signal CON1 and the data received via the first I/O line IO1. The second driver 23B includes a PMOS drive transistor 23B1 and an NMOS drive transistor 23B2 and the operation of the second I/O line sensing amplifying circuit 23 is substantially same as that of the first I/O line sensing amplifying circuit 21.

For instance, when data supplied on the first I/O line IO1 has a high logic level and a control signal CON1 has a high logic level, the first sensing amplifier 21A generates the signals SO11 and SO12 with a low logic level. The PMOS drive transistor 21B1 of the first driver 21B is turned on responsive to signal SO11 and the NMOS drive transistor 21B2 of the first driver 21B is turned off responsive to signal SO12, and thus, the first driver 21B provides a tri-state output to the data bus line DB with a high logic level.

When the data supplied on the first I/O line IO1 has a low logic level and the control signal CON1 has a high logic level, the first sensing amplifier 21A generates the signals SO11 and SO12 with a high logic level. The PMOS drive transistor 21B1 and the NMOS drive transistor 21B2 of the first driver 21B are turned off and turned on, respectively, and thus, the first driver 21B provides a tri-state output to the data bus line DB with a low logic level.

When the control signal CON1 has a low logic level, the first sensing amplifier 21A generates signal SO11 with a high logic level and signal SO12 with a low logic level regardless of the logic level of the data received via the first I/O line IO1. Thus, both the PMOS drive transistor 21B1 and the NMOS drive transistor 21B2 of the first driver 21B are turned off, and the first driver 21B provides the data bus line DB with a floating tri-state output.

Figure 3:
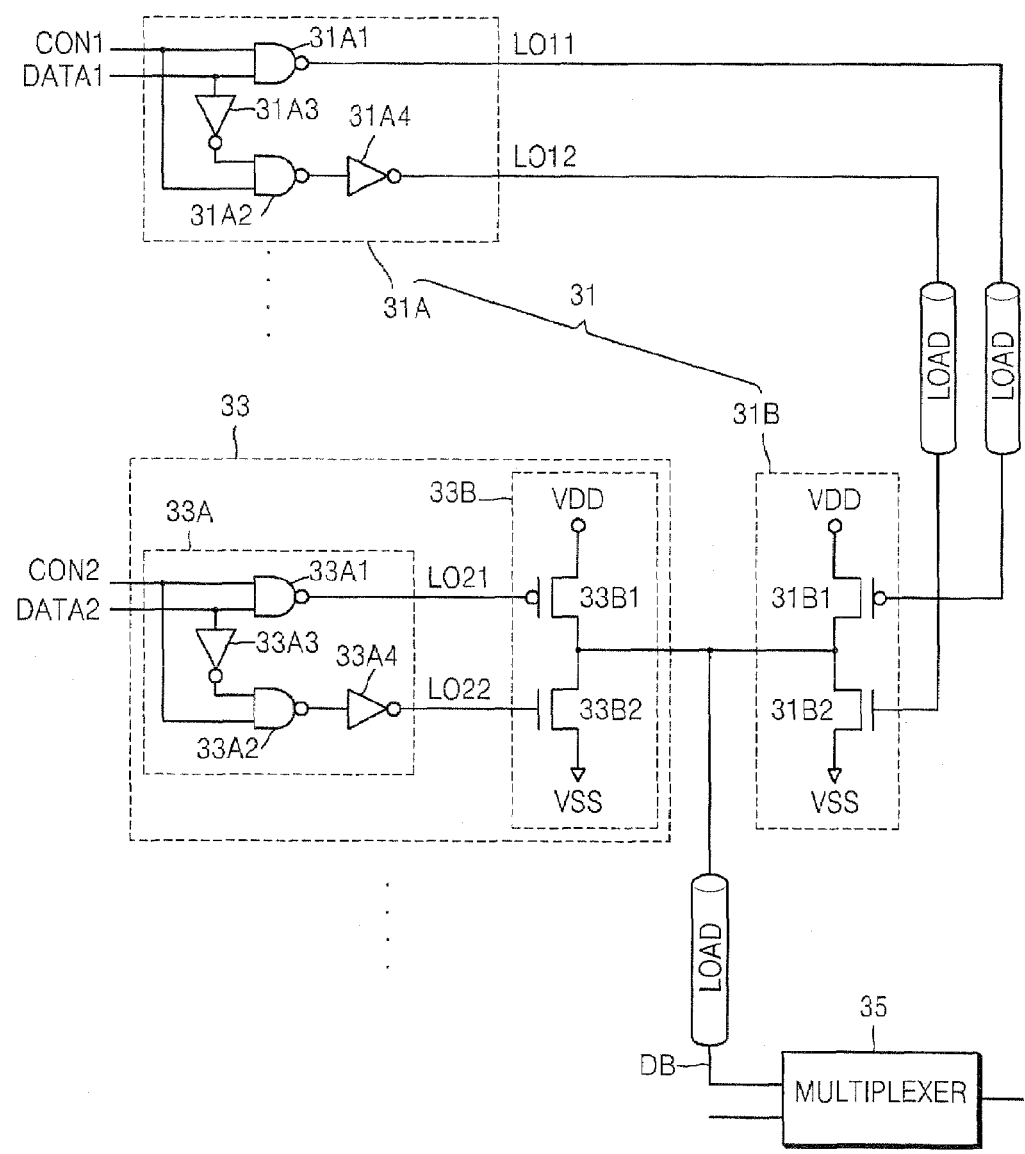
FIG. 3 is a circuit diagram of a memory device that uses a tri-state output driver configuration according to another embodiment of the present invention.

FIG. 3 is a circuit diagram of a memory device that uses a tri-state output driver configuration according to another embodiment of the present invention. Referring to FIG. 3, a plurality of first and second logic circuits 31 and 33 are connected to a shared output line DB, and first and second data signals DATA1 and DATA2 are respectively input to the first and second logic circuits 31 and 33.

Each of the first and second logic circuits 31 and 33 includes an input unit and a driver. The first logic circuit 31 includes a first input unit 31A generates signals LO11 and LO12 responsive to the first data signal DATA1, and a first driver 31B to provide a tri-state output to an output line DB in response to signals LO11 and LO12 from the first input unit 31A.

The second logic circuit 33 includes a second input unit 33A generates signals LO21 and LO22 responsive to the second data signal DATA2, and a second driver 33B to provide a tri-state output to the output line DB in response to signals LO21 and LO22 from the second input unit 33A. The first and second logic circuit 31 and 33 send the tri-state output signals over the output line DB to a multiplexer 35.

The second input unit 33A and the second driver 33B of the second logic circuit 33 are arranged or configured in the common region, while the first input unit 31A and the first driver 31B of the first logic circuit 31 are arranged in different regions. The first driver 31B of the first logic circuit 31 is configured such that a tri-state output load from the first driver 31B is substantially the same as the tri-state output load from the second driver 33B of the second logic circuit 33. The length of the output line DB can be reduced, thus decreasing a data transmission delay associated with the output line DB and improving the operating speed of the memory device.

The first input unit 31A includes a first NAND gate 31A1, a second NAND gate 31A2, a first inverter 31A3, and a second inverter 31A4. The second input unit 33A includes a first NAND gate 33A1, a second NAND gate 33A2, a first inverter 33A3, and a second inverter 33A4. Although the first and second input units 31A and 33A are shown including inverters and NAND gates, in some embodiments they may be variously configured or constructed.

The first driver 31B includes a PMOS drive transistor 31B1 and an NMOS drive transistor 31B2. The second driver 33B includes a PMOS drive transistor 33B1 and an NMOS drive transistor 33B2. The first driver 31B provides a tri-state output (a logic-high output, a logic-low output, or a float output) to the output line DB according to the logic levels of the control signal CON1 and the first data signal DATA1. The operation of the second logic circuit 33 may be substantially the same as that of the first logic circuit 31.

When the first data signal DATA1 has a high logic level and a control signal CON1 has a high logic level, the first input unit 31A generates signals LO11 and LO12 with a low logic level. The PMOS drive transistor 31B1 and the NMOS drive transistor 31B2 of the first driver 31B are respectively turned on and turned off, and thus, a tri-state output to the output line DB has a high logic level.

When the first data signal DATA1 has a low logic level and the control signal CON1 has a high logic level, the first input unit 31A generates signals LO11 and LO12 from with a high logic level. The PMOS drive transistor 31B1 and the NMOS drive transistor 31B2 of the first driver 31B are turned off and turned on, respectively, and thus, a tri-state output to the output line DB has a low logic level.

When the control signal CON1 has a logic low level, the first logic unit 31A generates signals LO11 and LO12 with high and low logic levels, respectively, regardless of the logic level of the first data signal DATA1. Thus, both the PMOS drive transistor 31B1 and the NMOS drive transistor 31B2 of the first driver 31B are turned off, and the tri-state output to the output line DB is floating.

As described above, in a memory device that uses a tri-state output driver configuration according to an embodiment of the present invention, the length of a data bus line can be reduced, thus decreasing the load on the data bus line. Accordingly, a data transmission delay over the data bus line is reduced, thus improving the operating speed of the memory device. The above tri-state output driver arranging method according to an embodiment of the present invention may be applied to other types of logic circuits, and not just I/O line sensing amplifying circuits.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A device comprising:
   a first sensing amplifier to amplify data received from a memory array;
   a first driver to generate a first tri-state signal responsive to the amplified data from the first sensing amplifier and to provide the first tri-state signal to a data bus line;
   a second sensing amplifier to amplify data received from the memory array; and
   a second driver to generate a second tri-state signal responsive to the amplified data from the second sensing amplifier, and to provide the second tri-state signal to the data bus line, where a first output loading on the first sensing amplifier as affected by the first driver is different from a second output loading on the second sensing amplifier as affected by the second driver, and where the first driver and the second driver provide a substantially equal load to the data bus line.

2. The device of claim 1 where the data bus line receives the first tri-state signal from the first driver and the second tri-state signal from the second driver at a substantially common location on the data bus line.

3. The device of claim 1 where the first driver includes
   a first transistor configured to output a supply voltage to the data bus line responsive to a first output signal from the first sensing amplifier;
   a second transistor configured to output a ground voltage to the data bus line responsive to a second output signal from the first sensing amplifier,
   wherein the first transistor and second transistor are configured to provide a floating tri-state output responsive to the first output signal and the second output signal.

4. The device of claim 3 wherein the first sensing amplifier includes
   a NAND gate to generate the first output signal responsive to a control signal and a first data signal from the memory array;
   a first inverter to invert the first data signal from the memory array;
   a second NAND gate to generate an internal signal by performing a NAND operation on the control signal and a inverted first data signal; and
   a second inverter to generate the second output signal by inverting the internal signal.

5. The device of claim 4, wherein:
   a first input terminal of the NAND gate is structured to receive the control signal;
   a second input terminal of the NAND gate is structured to receive the first data signal;
   an input terminal of the first inverter is directly coupled to the second input terminal of the NAND gate to receive the first data signal;
   an output terminal of the first inverter is directly coupled to a first input terminal of the second NAND gate; and
   a second input terminal of the second NAND gate is directly coupled to the first input terminal of the NAND gate to receive the control signal.

6. The device of claim 5, wherein:
   an output terminal of the NAND gate is coupled to a gate of the first transistor;
   an output terminal of the second NAND gate is directly coupled to an input terminal of the second inverter; and
   an output terminal of the second inverter is coupled to a gate of the second transistor.

7. The device of claim 1 where the second driver includes
   a first transistor configured to output a supply voltage to the data bus line responsive to a first output signal from the second sensing amplifier;
   a second transistor configured to output a ground voltage to the data bus line responsive to a second output signal from the second sensing amplifier,
   wherein the first transistor and second transistor are configured to provide a floating tri-state output responsive to the first output signal and the second output signal.

8. The device of claim 7 where the second sensing amplifier includes
   a NAND gate to generate the first output signal responsive to a control signal and a first data signal from the memory array;
   a first inverter to invert the first data signal from the memory array;
   a second NAND gate to generate an internal signal by performing a NAND operation on the control signal and a inverted first data signal; and
   a second inverter to generate the second output signal by inverting the internal signal.

9. The device of claim 8, wherein:
   a first input terminal of the NAND gate is structured to receive the control signal;
   a second input terminal of the NAND gate is structured to receive the first data signal;
   an input terminal of the first inverter is directly coupled to the second input terminal of the NAND gate to receive the first data signal;
   an output terminal of the first inverter is directly coupled to a first input terminal of the second NAND gate; and
   a second input terminal of the second NAND gate is directly coupled to the first input terminal of the NAND gate to receive the control signal.

10. The device of claim 9, wherein:
    an output terminal of the NAND gate is coupled to a gate of the first transistor;
    an output terminal of the second NAND gate is directly coupled to an input terminal of the second inverter; and
    an output terminal of the second inverter is coupled to a gate of the second transistor.

11. A method comprising:
    arranging a first sensing amplifier and a first driver responsive to amplified data
    from the first sensing amplifier, the first driver generating a first tri-state output signal on a data bus line; and arranging a second sensing amplifier and a second driver responsive to amplified data from the second amplifier, the second driver generating a second tri-state output signal on the data bus line, where a first output loading on the first sensing amplifier as affected by the first driver is different from a second output loading on the second sensing amplifier as affected by the second driver, and where the second tri-state output loads the data bus line substantially the same as the first tri-state output.

12. The method of claim 11 where the data bus line receives the first tri-state signal from the first driver and the second tri-state signal from the second driver at a substantially common location on the data bus line.

* * * * *